(12) United States Patent
Zapata et al.

(10) Patent No.: US 11,243,236 B2
(45) Date of Patent: Feb. 8, 2022

(54) DEVICE AND METHOD FOR MONITORING POWER QUALITY AND PERFORMANCE OF ELECTRICITY DISTRIBUTION COMPONENTS IN ELECTRICITY DISTRIBUTION NETWORK

(71) Applicant: Edge Electrons Limited, Hong Kong (HK)

(72) Inventors: Jian Carlo Decena Zapata, Pampanga (PH); Efren Santos Cruzat, II, Makati (PH); Leonard Ostil Torio, Quezon (PH); Gordon Currie, Makati (PH); Neal George Stewart, Makati (PH)

(73) Assignee: Edge Electrons Limited, Hong Kong (HK)

( * ) Notice: Subject to any disclaimer, the term of this patent is extended or adjusted under 35 U.S.C. 154(b) by 43 days.

(21) Appl. No.: 16/636,019

(22) PCT Filed: Aug. 1, 2018

(86) PCT No.: PCT/IB2018/055764
§ 371 (c)(1),
(2) Date: Feb. 2, 2020

(87) PCT Pub. No.: WO2019/025988
PCT Pub. Date: Feb. 7, 2019

(65) Prior Publication Data
US 2021/0318363 A1    Oct. 14, 2021

Related U.S. Application Data

(60) Provisional application No. 62/540,079, filed on Aug. 2, 2017.

(51) Int. Cl.
*G01R 19/25* (2006.01)
*G01R 15/18* (2006.01)
(Continued)

(52) U.S. Cl.
CPC ....... *G01R 19/2513* (2013.01); *G01R 15/181* (2013.01); *G01R 31/40* (2013.01);
(Continued)

(58) Field of Classification Search
CPC .. G01R 19/2513; G01R 15/181; G01R 31/40; H02J 3/0012; H02J 13/00017;
(Continued)

(56) References Cited

U.S. PATENT DOCUMENTS

| 2004/0153270 | A1* | 8/2004 | Yamashita | G01N 33/383 |
| | | | | 702/81 |
| 2010/0070213 | A1* | 3/2010 | Anklam | H02J 13/00002 |
| | | | | 702/60 |
| 2017/0220404 | A1* | 8/2017 | Seminario | G06F 11/0736 |

* cited by examiner

*Primary Examiner* — Giovanni Astacio-Oquendo
(74) *Attorney, Agent, or Firm* — Idea Intellectual Limited; Margaret A. Burke; Sam T. Yip

(57) ABSTRACT

A device and method are provided for monitoring quality and performance parameters of an electricity distribution component in an electricity distribution network and detecting any deviation of operating parameters from the specified regulatory set and enforced limits. The critical and increasing problem is mitigated for the myriad of private domestic and commercial DEG devices being installed and connected to the distribution networks which were not initially designed for, or even not anticipated with, the recent DEG evolution, and the increasing complex electrical components with changing loads and power factors across the distribution network.

14 Claims, 1 Drawing Sheet

(51) Int. Cl.
*G01R 31/40* (2020.01)
*H02J 3/38* (2006.01)
*H02J 13/00* (2006.01)
*H02J 3/00* (2006.01)

(52) U.S. Cl.
CPC ............ *H02J 3/0012* (2020.01); *H02J 3/381* (2013.01); *H02J 13/00002* (2020.01); *H02J 13/00017* (2020.01); *H02J 13/00022* (2020.01); *H02J 13/00034* (2020.01)

(58) Field of Classification Search
CPC ........... H02J 13/00002; H02J 13/00034; H02J 13/00022; H02J 3/381
USPC .................................... 324/764.01, 537, 500
See application file for complete search history.

DEVICE AND METHOD FOR MONITORING POWER QUALITY AND PERFORMANCE OF ELECTRICITY DISTRIBUTION COMPONENTS IN ELECTRICITY DISTRIBUTION NETWORK

CROSS-REFERENCE OF RELATED PATENTS AND PATENT APPLICATIONS

This application claims priority to the U.S. Provisional Patent Application No. 62/540,079, filed Aug. 2, 2017, the disclosure of which is incorporated herein by reference in its entirety.

FIELD OF THE INVENTION

The present invention relates to improving power quality and performance of electricity distribution networks. Particularly, the present invention relates to a device and method for monitoring power quality and performance of electricity distribution components in an electricity distribution network.

BACKGROUND

The present legacy electrical system and power quality being delivered to users is being degraded by a number of disruptive technology and legislative impacts, especially with the rapidly increasing myriad of privately owned and operated domestic and commercial Distributed Energy Generation (DEG) devices connected at any point across a low voltage LV power distribution network. This increasing degradation in power quality being delivered to the end consumers, especially voltage volatility, current and frequency aberrations, can negatively impact the performance or even damage electrical equipment, appliances, and electronic devices connected to the electrical power system in the user premises, and can even trip and disrupt wider area LV power distribution network, substation protective equipment, high voltage (HV) transmission grids, and even generators, thus posing significant safety risks.

This increasing degradation in power quality affects connected distribution electrical components such as distribution switch gears and transformers. Degradation relating to parameters such as, but not limited to—voltage, current, harmonics, temperature, pressure, mechanical deformation, frequency, and specified operating performance aberrations, etc. not only adversely impacts the performance but also damages electrical equipment, appliances and electronic devices, especially distribution components being connected to the electrical systems.

Referring to FIG. 1, the legacy alternate current (AC) electrical power systems, which started in the later 1800's, had limited transmission capabilities due to low voltage components, and over short distances. So a myriad of separate independent power producers (IPP)'s sprang up with a central generator and supplied power to local areas or local power islands. Back then, there were a range of voltages and various frequencies for each local area or local power island. The loads were simple which comprised largely incandescent electrical lighting.

Referring to FIG. 2, as electrical technologies advanced, with HV insulators and switches, transmission voltages were allowed to increase hence enabling the delivery of higher electrical power over longer distances. Voltage levels increased rapidly from Edison's initial 220 VDC local grids, to the first AC grids of 2.3 KVAC (1893), rising every few years to 765 KVAC (late 1960's). With longer transmission grids resulted in overlapping power islands, conflicts began in areas of business, competing technical standards, and finally monopolies emerged. With the increasing use of electrical power, questionable reliability, and growing conflicts in the electrical industry, many countries moved to legislate regulatory controls over their electrical industries.

Reaching the present day, what resulted from deregulation legislation was DEG, which was the ability of connecting small power generators to the HV transmission grids. With still further technology advances in power generation such as CHP micro-turbines, fuel cell installations, and especially renewable energy sources such as photovoltaic (PV), solar thermal, and wind, coupled with falling capital costs, private owners in domestic and commercial premises have started purchasing and installing these small DEG devices.

These small, privately-owned and operated domestic and commercial DEG device installations accelerated with the introduction of (then later updated and modified) Feed-n-Tariff (FIT) policy over the last few years. The FIT mandates transmission operators pay owners of DEG devices minimum prices for excess power generated and added back into the energy grid. So now with a myriad of privately-owned and operated domestic and commercial DEG devices, connected in increasing numbers to the local LV distribution networks, it is creating a large impact on power quality for not only the end consumers, but the increasing real possibility of wide area major grid disruptions. This is due to increasing possibility of a transmission grid trip due to the reduction of spinning reserves with the offloading of the large central utilities due to additional power being generated by the growing number of installed DEG devices. The resultant voltage, current and frequency aberrations from these privately-owned and operated domestic and commercial DEG devices that are superimposed onto the distribution networks and transmission grids increases the possibility of setting off the system trip protective switch gear, normally adjusted to the tight tolerance and long-established legacy electrical power specifications.

Power quality is defined under the following specifications, the key parameters being consistent and stable voltage, harmonics, and frequency of the electrical power delivered to the user. With the advent of more and more electronic devices and equipment being connected to the electrical system which are complex electrical loads, especially with the increasing power demand being domestic and commercial, rather than industrial such as in the United States, these electronic devices, since they offer more complex loads to the electrical system, can introduce electrical power instability. These electronic devices are generally located in domestic and commercial premises with increasing power demands from the LV distribution networks, adding to the voltage instability with changing loads and power factors across the distribution networks.

When the legacy central generating utilities owned the complete equation of generation, transmission and distribution end to end, they agreed to, and could meet, the legislated tight power quality standards specified and enforced by government and regulatory bodies. With the advent of even further de-regulation of the electricity industry in many countries, and expanding FIT, allowing the connection of an increasing myriad of privately owned and operated domestic and commercial DEG devices to the LV distribution network and increasing complex loads and changing power factors, there is an increasing critical degradation of power quality especially voltage instability and increased potential of local and large area major power disruptions.

These power quality standards have a long history of regulatory normalization across each country, and even across the world, particularly with the advent of electrical transmission major grid connections between countries. Examples of electrical LV distribution mains standards by some countries are as follows, referencing nominal voltage, voltage tolerance, nominal frequency, and frequency tolerance, for the LV distribution network for domestic and commercial users:

| Country | Regulatory | Nominal voltage (VAC RMS) | voltage Tolerance (%) | Normal frequency (Hz) | frequency Tolerance (%) |
|---|---|---|---|---|---|
| USA | FERC/ NERC | 120 (1φ) 240(1φ) 120/208(3φ) | ±5 | 60 | ±1 |
| UK | EN50160 | 230 (1φ/3φ) | +10, −6 | 50 | ±1 |

Many countries have similar nominal LV Distribution POU voltages such as 220/230/240 VAC (and trending this higher distribution network voltage to 230 VAC), and lower voltages generally 110/115/120 VAC, with frequency now standard at 50 Hz or 60 Hz, generally 50 Hz for the higher 220/230/240 VAC voltages, and 60 Hz for the lower 110/115/120 VAC voltages, but either frequency is used in some countries due to their electrical power system history. Voltage tolerance can be standardized at ±5%/±6%/+10, −6%/±10%, the maximum tolerance in any country is set at ±10%.

Frequency tolerance is normally standardized in many countries to ±1%, some countries have ±2%, which is the maximum frequency tolerance allowed.

The electrical power industry and regulatory bodies are grappling with this new and disruptive evolution in the legacy electrical system. Some sensing devices have been designed to monitor electrical network distribution. For example, US Patent Application Publication No. 2014/0039712A1 discloses a smart meter for monitoring and controlling some of the major electrical network distribution parameters, such as voltage, but the data and information from the smart meter is limited to residential information, such as energy usage, typically in KWHour.

Therefore, there is a need for a more versatile and cost-effective device and method for monitoring the power quality and performance parameters of electrical devices including distribution components across the distribution networks.

SUMMARY OF THE INVENTION

It is one objective to mitigate the critical and increasing problem of the myriad of private domestic and commercial DEG devices being installed and connected to the distribution networks which were not initially designed for, or even not anticipated with, the recent DEG evolution, and also cope with the increasing complex electrical components with changing loads and power factors across the distribution network.

According to one aspect of the present invention, a device and a method are provided for monitoring quality and performance parameters of an electricity distribution component in an electricity distribution network and detecting any deviation of operating parameters from the specified regulatory set and enforced limits. The monitoring device may comprise one or more measurement units configured to measure operating parameters of the electricity distribution components; one or more processing units configured to process the measured operating parameters to compute power quality and performance parameters of the distribution component and compare the computed power quality and performance parameters to factory-manufactured values to indicate loss of performance or degradation.

Technical specified operating performance parameters that can be monitored, data processed, transmitted may include, for example, but are not limited to:

1) rapid voltage changes;
2) low frequency voltage change causing flicker;
3) under voltage dips (under −10%);
4) over voltage surges (over +10%);
5) overvoltage spikes and noise;
6) voltage unbalance in 3-phase system;
7) voltage harmonics;
8) current harmonics;
9) power factor (PF) also the phase of the voltage and current being out of phase due to reactive power imbalance referred to as power factor (PF=1, V and I in phase, PF=0, V and I—180° out of phase) can also create not only voltage and current harmonic problems, but also electrical and electronic equipment, and especially in electrical motors and transformers and distribution components, wasted power, under performance, and also possible damage;
10) current imbalance also in the 3-phase system, where each phase is loaded with unequal currents can cause transmission and distribution equipment damage, degraded power quality and possible safety risk;
11) frequency deviations also can impact performance and operation of electrical and electronic devices, transformers, and electrical motors; and
12) specified operating parameters such as temperature, pressure deviations, mechanical deviations, and operating malfunctions such as arcing, impedance deviations, etc.

DETAILED DESCRIPTION

In the following description, methods and apparatuses for monitoring power quality and performance parameters of an electricity distribution component in an electricity distribution network and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
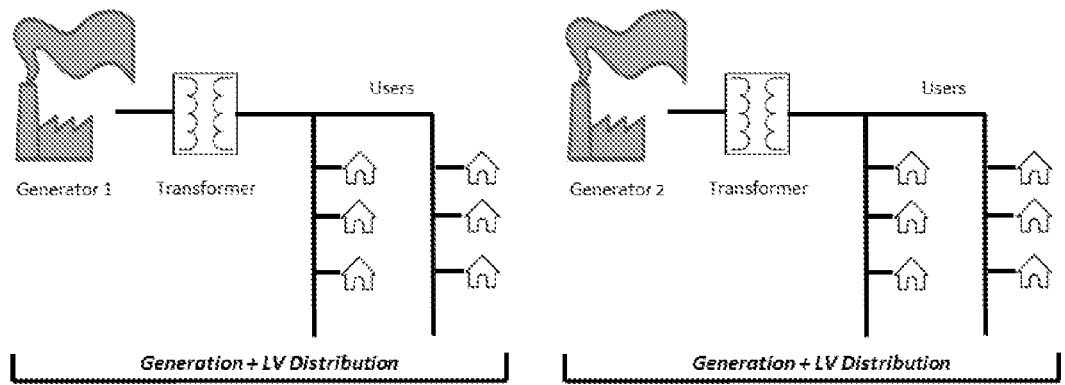
FIG. 1. shows a myriad of separate IPPs sprang up with a central generator and supplied power limited to small local areas or local power islands.
Figure 2:
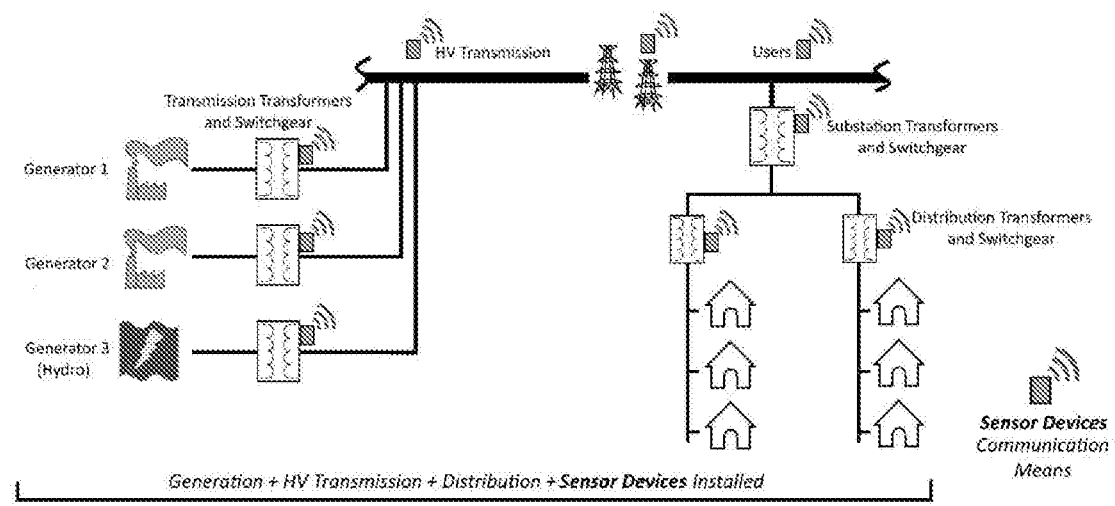
FIG. 2. shows a HV power distribution network which is installed with the sensor devices according to one embodiment of the present invention.

According to one aspect of the present invention, a device for monitoring power quality and performance parameters of an electricity distribution component in an electricity distribution network is provided. FIG. 2 shows a HV power distribution network which is installed with a monitoring device according to one embodiment of the present invention. The monitoring device may be installed directly at the point of the distribution network or electrical equipment to be monitored. In particular the sensor device can be connected close to, or directly on or integrated into the electricity distribution component, and so that full performance of the component can be monitored, processed and then transmitted remotely. The electricity distribution component may be a substation electrical transformer, a distribution electrical transformer, a substation switch gear or a distribution switch gear.

In some embodiments, the monitoring device may comprise one or more measurement units configured to measure operating parameters of the electricity distribution components; one or more processing units configured to process the measured operating parameters to compute power quality and performance parameters of the distribution component and compare the computed power quality and performance parameters to factory-manufactured values to indicate loss of performance or degradation; and one or more communication units configured to transmitting the detected loss or degradation of performance of electricity distribution component to a remote server. The operating parameters may include, but not limit to, input and output electric current, voltage, power factor, frequency deviation, impedance, inductance, capacitance, reactive electrical properties and temperature. The power quality and performance parameters may include, but are not limited to, losses, efficiency with changing loads.

In some embodiments, the processing units may be further configured to execute firmware including machine instructions for: predicting failure of the distribution component; determining lifetime estimates of power quality and performance parameter values; processing and transmitting non-invasive load monitoring (NILM) data; receiving a remote update on the firmware from the remote server and updating the firmware; receiving a remote resetting command from the remote server and resetting a state of execution of the firmware; receiving detection signals and generating corresponding warning signals for one or more of: device tampering, illegal power tapping, serious load current imbalance, voltage imbalances, and NILM data for load monitoring. The remote server may be, for example but not limited to, a cloud server.

In some embodiments, the measurement units may further comprise one or more Rogowski current transformers (CTs) for measuring electric currents of the electricity distribution component. The processing units may further be configured to execute firmware including machine instructions for receiving calibration factors and causing calibration of the Rogowski CTs.

The calibration factors for each Rogowski CTs may be stored in the remote server and transmitted to the monitoring devices to make sure that any Rogowski CT selected from inventory for installation or replacement can measure the electric current accurately. The calibration factors of each Rogowski CT may be obtained by scanning a bar code of the Rogowski CT or registering a serial number of the Rogowski CT.

In some embodiments, the Rogowski CTs inherent wide frequency response enables the device to measure high frequency components of the measured electric currents to detect faults including one or more of: electric arcing, plurality of harmonics, electricity distribution network operating performance problem, and the electricity distribution component operating performance problem.

Conventionally, CTs which are with magnetic cores are used to monitor electrical currents. However, they are heavy, large, and also can only be used for limited current ranges as the current transformer magnetic cores may saturate easily to cause incorrect current measurements. In contrast, Rogowski CTs have no magnetic core, hence can tolerate a very wide range of currents.

To address the issue that a Rogowski CT can generate a very wide range of output voltages, an auto-ranging unit may be used and configured to automatically adjust measurement reading signals to normalized levels for different electricity distribution current or voltage ranges. With the auto-ranging unit, the monitoring device can respond to the very wide range of Rogowski CT output voltages by establishing an auto-range function, that automatically adjusts the Rogowski CT output voltages to a normalized level that allows the same standard Rogowski CT to be used across a very wide range of distribution applications, without the need for more CTs.

In some embodiments, the monitoring device may further comprise a high frequency signal driving unit for generating a high frequency signal to be injected into a voltage or current port of the electricity distribution component to measure high frequency performance parameters and detecting indication of degradation of high frequency performance of the electricity distribution component by comparing the measured high frequency performance parameters with factory-manufactured values. The indication of high frequency performance may comprise high order voltage harmonics, current harmonics, and wavelets.

In some embodiments, the monitoring device may further comprise a temperature sensor for measuring an external temperature of the electricity distribution component and an ambient temperature. The processing units may be further configured to execute firmware including machine instructions for: obtaining one or more compensating correction factors; computing a thermal model of the electricity distribution component using the compensating correction factors; and computing an internal temperature of the electricity distribution component using the measured external temperature of the electricity distribution component, the computed thermal model of the electricity distribution component, and the measured ambient temperature.

The temperature sensor can be an infrared thermal sensor mounted externally on a shell of the electricity distribution component. For measuring temperatures of some components, such as oil filled distribution equipment, in which the temperature sensor cannot be mounted locally on the component, a fiber optic temperature sensor can be utilized. The fiber optic temperature sensor comprises an optical fiber configured to be used as a transducer for converting temperature changes into changes in optical properties, such as light intensity or wavelengths, of an optical signal. The optical fiber also acts as a medium for transmitting the optical signal to an optical sensor for converting optical signals to electrical signals. As optical fiber is immune to electromagnetic interference and high voltage, and supports long distance transmission, it can be mounted anywhere internal or external to the electricity distribution components.

In some embodiments, the monitoring device may comprise a housing with a transparent window and the temperature sensor can be installed internally in the device for temperature monitoring.

According to another aspect of the present invention, a method for monitoring power quality and performance parameters of an electricity distribution component in an electricity distribution network is provided. The method comprises: measuring, with one or more measurement units, operating parameters of the electricity distribution components; processing, with one or more processing units, the measured operating parameters to compute power quality and performance parameters of the distribution component; comparing, with the processing units, the computed power quality and performance parameters to factory-manufactured values to indicate loss of performance or degradation; and transmitting, with one or more communication units, the detected loss or degradation of performance of electricity distribution component to a remote server.

In some embodiments, the method further comprises executing, with the processing units, firmware including machine instructions for: predicting failure of the distribution component; determining lifetime estimates of power quality and performance parameter values; processing and transmitting non-invasive load monitoring (NILM) data; receiving a remote update on the firmware from the remote server and updating the firmware; receiving a remote resetting command from the remote server and resetting a state of execution of the firmware; receiving detection signals and generating corresponding warning signals for one or more of: device tampering, illegal power tapping, serious load current imbalances, voltage imbalances, and NILM data for load monitoring.

In some embodiments, the method further comprises measuring, with one or more Rogowski CTs, electric currents of the electricity distribution component; and executing, with the processing units, firmware including machine instructions for receiving calibration factors and causing calibration of the Rogowski CTs.

In some embodiments, the method further comprises measuring, with the Rogowski CTs, high frequency components of the measured electric currents to detect faults including one or more of: electric arcing, plurality of harmonics, electricity distribution network operating performance problem, and the electricity distribution component operating performance problem.

In some embodiments, the method further comprises adjusting, with one or more auto-ranging units, measurement reading signals to normalized levels for different electricity distribution current or voltage ranges.

In some embodiments, the method further comprises generating, with a high frequency signal driving unit, a high frequency signal to be injected into a voltage or current port of the electricity distribution component for measuring high frequency performance parameters; and detecting indication of degradation of high frequency performance of the electricity distribution component by comparing the measured high frequency performance parameters with factory-manufactured values.

In some embodiments, the method further comprises measuring an external temperature of the electricity distribution component and an ambient temperature; executing firmware including machine instructions for: obtaining compensating correction factors; computing a thermal model of the electricity distribution component using the compensating correction factors; and computing an internal temperature of the electricity distribution component using the measured external temperature of the electricity distribution component, the computed thermal model of the electricity distribution component, and the measured ambient temperature.

The embodiments disclosed herein may be implemented using general purpose or specialized computing devices, computer processors, microcontrollers, or electronic circuitries including but not limited to digital signal processors (DSP), application specific integrated circuits (ASIC), field programmable gate arrays (FPGA), and other programmable logic devices configured or programmed according to the teachings of the present disclosure. Computer instructions or software codes running in the general purpose or specialized computing devices, computer processors, or programmable logic devices can readily be prepared by practitioners skilled in the software or electronic art based on the teachings of the present disclosure.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

The invention claimed is:

1. A device for monitoring one or more power quality and performance parameters of an electricity distribution component in an electricity distribution network, comprising:
one or more measurement units configured to measure operating parameters of the electricity distribution component;
one or more processing units configured to;
process the measured operating parameters to compute power quality and performance parameters of the distribution component and compare the computed power quality and performance parameters to factory-manufactured values to detect loss or degradation of performance of the electricity distribution components; and
execute firmware including machine instructions for:
predicting failure of the distribution component;
determining lifetime estimates of one or more power quality and performance parameter values;
processing and transmitting non-invasive load monitoring (NILM) data;
receiving a remote update on the firmware and updating the firmware;
receiving a remote resetting command and resetting a state of execution of the firmware; and
receiving one or more detection signals and generating one or more corresponding warning signals for one or more of: device tampering, illegal power tapping, load current imbalance, voltage imbalances, and NILM data for load monitoring; and
one or more communication units configured to transmitting the detected loss or degradation of performance of electricity distribution component to a remote server;
wherein the device is installed close to, directly on, or integrated into the electricity distribution component.

2. The device of claim 1, further comprises an auto-ranging unit configured to automatically adjust one or more measurement reading signals to one or more normalized levels for different electricity distribution current or voltage ranges.

3. The device of claim 1, further comprising:
a Rogowski current transformer (Rogowski CT) for measuring electric currents of the electricity distribution component;
the one or more processors are further configured to execute firmware including machine instructions for receiving one or more calibration factors and causing calibration of the Rogowski CT;

wherein the Rogowski CT inherent wide frequency response enables the device to measure one or more high frequency components of the measured electric currents to detect faults including one or more of electric arcing, plurality of harmonics, electricity distribution network operating performance problem, and the electricity distribution component operating performance problem.

4. The device of claim 1, further comprising a high frequency signal driving unit for:
generating a high frequency signal to be injected into a voltage or current port of the electricity distribution component to measure high frequency performance parameters; and
detecting indication of degradation of high frequency performance of the electricity distribution component by comparing the measured high frequency performance parameters with factory-manufactured values;
wherein the indication of high frequency performance may comprise high order voltage harmonics, current harmonics, and wavelets.

5. The device of claim 1,
wherein the measurement units further comprise a temperature sensor for measuring an external temperature of the electricity distribution component and an ambient temperature; and
wherein the processing units are further configured to execute firmware including machine instructions for:
obtaining one or more compensating correction factors;
computing a thermal model of the electricity distribution component using the compensating correction factors; and
computing an internal temperature of the electricity distribution component using the measured external temperature of the electricity distribution component, the computed thermal model of the electricity distribution component, and the measured ambient temperature.

6. The device of claim 5, wherein the temperature sensor is an infrared thermal sensor mounted externally on the shell of the electricity distribution component.

7. The device of claim 5, wherein the temperature sensor is a fiber optic temperature sensor comprising an optical fiber configured to:
convert temperature changes into optical property changes of an optical signal; and
transmit the optical signal to an optical sensor.

8. The device of claim 5, further comprising a housing with a transparent window; wherein the temperature sensor is installed internally in the device for temperature monitoring.

9. The device of claim 1, wherein the electricity distribution component is any one of: a substation electrical transformer, substation switch gear, distribution electrical transformer and distribution switch gear.

10. A method for monitoring one or more power quality and performance parameters of an electricity distribution component in an electricity distribution network, comprising:
measuring, with one or more measurement units, operating parameters of the electricity distribution components;
processing, with one or more processing units, the measured operating parameters to compute power quality and performance parameters of the distribution component;
comparing, with the processing units, the computed power quality and performance parameters to factory-manufactured values to indicate loss of performance or degradation;
transmitting, with one or more communication units, the detected loss or degradation of performance of electricity distribution component to a remote server; and
executing, with the processing units, firmware including machine instructions for:
predicting failure of the distribution component;
determining lifetime estimates of power quality and performance parameter values;
processing and transmitting non-invasive load monitoring (NILM) data;
receiving a remote update on the firmware and updating the firmware;
receiving a remote resetting command and resetting a state of execution of the firmware; and
receiving detection signals and generating corresponding warning signals for one or more of: device tampering, illegal power tapping, serious load current, voltage imbalances, and NILM data for load monitoring.

11. The method of claim 10, further comprising: adjusting, with one or more auto-ranging units, measurement reading signals to normalized levels for different electricity distribution current or voltage ranges.

12. The method of claim 10, further comprising:
measuring, with one or more Rogowski CTs, high frequency components of electric currents of the electricity distribution component to detect faults including one or more of: electric arcing, plurality of harmonics, electricity distribution network operating performance problem, and the electricity distribution component operating performance problem; and
executing, with the processing units, firmware including machine instructions for receiving calibration factors and causing calibration of the Rogowski CTs.

13. The method of claim 10, further comprising:
generating, with a high frequency signal driving unit, a high frequency signal to be injected into a voltage or current port of the electricity distribution component for measuring high frequency performance parameters; and
detecting indication of degradation of high frequency performance of the electricity distribution component by comparing the measured high frequency performance parameters with factory-manufactured values.

14. The method of claim 10, further comprising:
measuring an external temperature of the electricity distribution component and an ambient temperature;
executing firmware including machine instructions for:
obtaining compensating correction factors;
computing a thermal model of the electricity distribution component using the compensating correction factors; and
computing an internal temperature of the electricity distribution component using the measured external temperature of the electricity distribution component, the computed thermal model of the electricity distribution component, and the measured ambient temperature.

* * * * *